(12) United States Patent
Tain et al.

(10) Patent No.: US 8,049,330 B2
(45) Date of Patent: Nov. 1, 2011

(54) WAFER-LEVEL CHIP SCALE PACKAGING FOR LED COMPRISING CARRIER SUBSTRATE WITH THERMALLY CONDUCTIVE THROUGH HOLES AND FILL CHANNELS

(75) Inventors: Ra-Min Tain, Chung-Ho (TW); Wei-Chung Lo, Zhonghe (TW); Li-Cheng Shen, Hsin-Chu (TW)

(73) Assignee: Industrial Technology Research Institute, Hsin-Chu (TW)

( * ) Notice: Subject to any disclaimer, the term of this patent is extended or adjusted under 35 U.S.C. 154(b) by 618 days.

(21) Appl. No.: 11/284,936

(22) Filed: Nov. 23, 2005

(65) Prior Publication Data
US 2006/0278885 A1    Dec. 14, 2006

(30) Foreign Application Priority Data

Jun. 14, 2005  (TW) ............... 94119688 A
Sep. 23, 2005  (TW) ............... 94133223 A (51) Int. Cl.
*H01L 23/36*    (2006.01)
*H01L 23/373*   (2006.01)

(52) U.S. Cl. ............... 257/720; 257/99; 257/E23.101

(58) Field of Classification Search ............... 257/713, 257/E23.101, E23.105, 99, 712, 720, E23.106, 257/E23.108, E23.109
See application file for complete search history.

(56) References Cited

U.S. PATENT DOCUMENTS

| | | | | |
|---|---|---|---|---|
| 5,698,866 A | * | 12/1997 | Doiron et al. | 257/99 |
| 5,710,459 A | * | 1/1998 | Teng et al. | 257/717 |
| 5,857,767 A | * | 1/1999 | Hochstein | 362/294 |
| 6,407,411 B1 | * | 6/2002 | Wojnarowski et al. | 257/99 |
| 6,482,674 B1 | * | 11/2002 | Kinsman | 438/106 |
| 6,498,355 B1 | | 12/2002 | Harrah et al. | |
| 7,449,067 B2 | * | 11/2008 | Andry et al. | 118/209 |
| 2002/0185718 A1 | * | 12/2002 | Mikubo et al. | 257/678 |
| 2004/0188696 A1 | * | 9/2004 | Hsing Chen et al. | 257/99 |
| 2004/0203189 A1 | | 10/2004 | Chen et al. | |
| 2004/0222433 A1 | * | 11/2004 | Mazzochette et al. | 257/99 |

* cited by examiner

*Primary Examiner* — Samuel Gebremariam
*Assistant Examiner* — Andrew O Arena
(74) *Attorney, Agent, or Firm* — Stout, Uxa, Buyan & Mullins, LLP (57) ABSTRACT

A structure of light emitting diode (LED) wafer-level chip scale packaging (WL-CSP) is disclosed. The process of making the same is also provided in this invention. The LED CSP utilizes the through hole metal filling to enhance heat conduction between the LED die and its carrier substrate. The CSP structure is achieved by bonding pre-processed through-hole-filling carrier substrate against the flip-chip LED wafer.

24 Claims, 14 Drawing Sheets

WAFER-LEVEL CHIP SCALE PACKAGING FOR LED COMPRISING CARRIER SUBSTRATE WITH THERMALLY CONDUCTIVE THROUGH HOLES AND FILL CHANNELS

BACKGROUND OF THE INVENTION

1. Field of the Invention

The present invention generally relates to light emitting diode (LED) packaging, and more particularly to light emitting diode (LED) wafer-level chip scale packaging (WL-CSP) for enhancing heat conduction.

2. Description of the Prior Art

Light emitting diode (LED) is a device that transforms electric power into light source. Compared with conventional light sources, the LED has advantages of low input voltage, low power consumption, and quick response time. Furthermore, the LED has other beneficial characteristics, such as light weight, low cost to manufacture, and capability of mass production. Accordingly, the LED has become an indispensable element in the modern life, especially in the electronic, communication, and consumer products fields.

One of the main purposes of semiconductor packaging is to protect the circuit chip from being damaged physically or chemically, ensuring the proper functionality of the integrated circuit. The selection of the packaging material is very important not only to meet the protection requirement, but also to enhance the reliability and functionality of the integrated circuit.

As the LED becomes more high-power, more heat is therefore generated, which disadvantageously leads to worsened characteristics, declined intensity, and even burnt-out device. Conventionally, the LED packaging seldom concerns the heat dissipation, which is at most treated in printed circuit board (PCB) level or in system level, albeit still not effectively solves the heat dissipation problem. Some exemplary heat-dissipating packaging designs and corresponding circuits are disclosed in U.S. Pat. No. 6,498,355 entitled 'High Flux LED Array' and are reproduced in FIG. 1A to FIG. 1C.

Figure 1A:
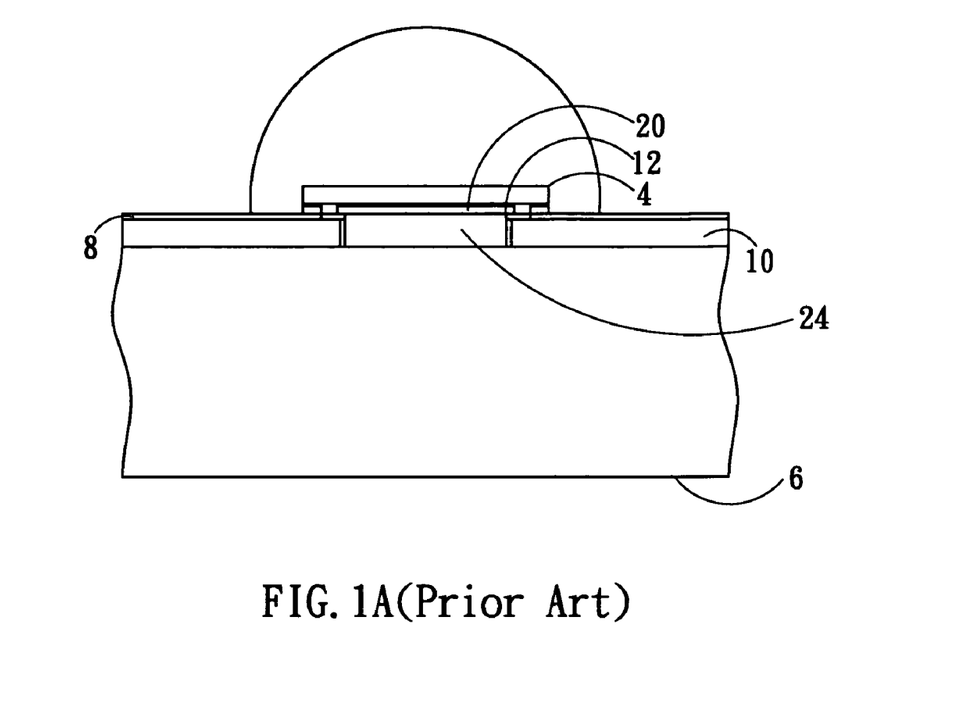
FIG. 1A to FIG. 1C show conventional heat-dissipating packaging and corresponding circuit.

As shown in FIG. 1A, an LED 4 is flipped on a printed circuit board, which consists of a dielectric layer 10 and conductive trace 8. The printed circuit board (8, 10) further overlies a metal substrate 6. The heat generated by the LED 4 is conducted through a thermal contact 20 and thermally conductive material 24, and finally to the metal substrate 6. The heat is further conducted through the via 12 in the printed circuit board (8, 10), which is filled with thermally conductive material.

Figure 1B:
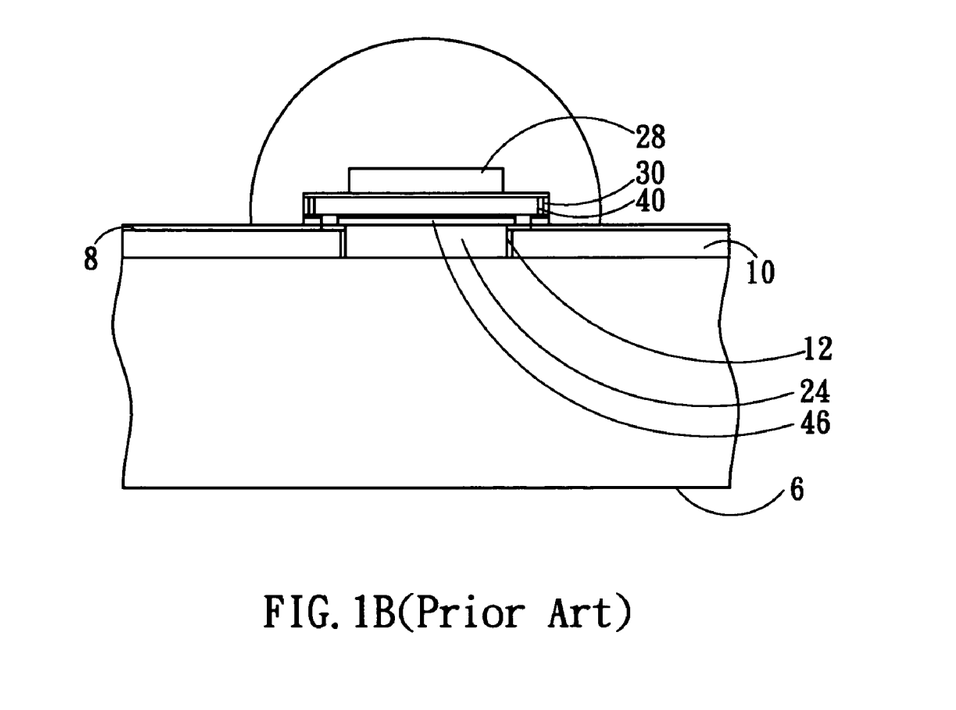

FIG. 1B shows another arrangement for dissipating the generated heat. Compared with that in FIG. 1A, a submount 30 is inserted between the LED 28 and the PCB (8, 10), and power channels 40 are devised within the submount 30 to facilitate the electrical power connection between the LED 28 and the conductive trace 8. Similar to FIG. 1A, the heat generated by the LED 28 is conducted through a thermal contact 46 and thermally conductive material 24, and finally to the metal substrate 6. The heat is further conducted through the via 12 in the printed circuit board (8, 10).

Figure 1C:
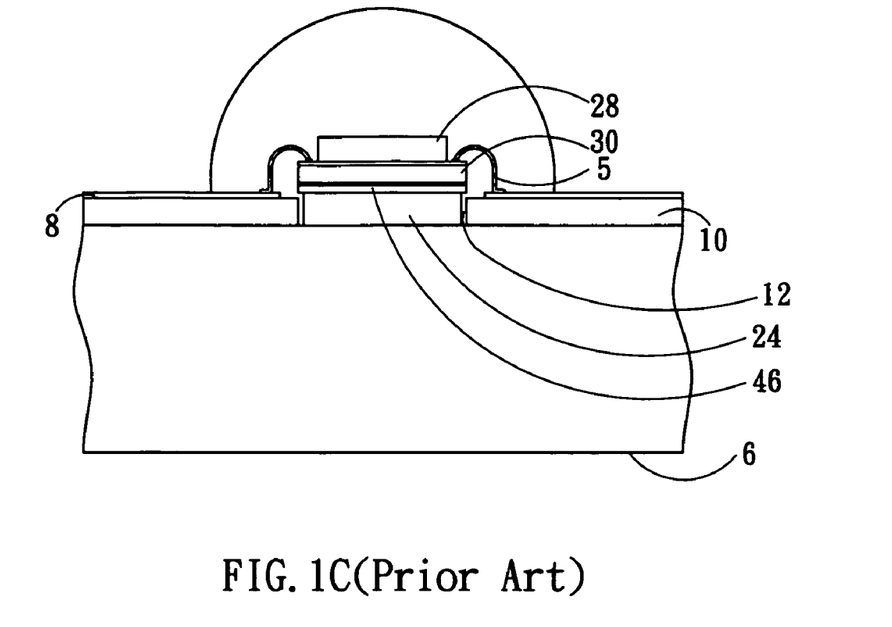

FIG. 1C shows a further arrangement for dissipating the generated heat. Compared with that in FIG. 1B, the electrical power connection is accomplished by way of bonded wires 5, instead of power channels. Similar to FIG. 1A or FIG. 1B, the heat generated by the LED 28 is conducted through a thermal contact 46 and thermally conductive material 24, and finally to the metal substrate 6. The heat is further conducted through the via 12 in the printed circuit board (8, 10).

The packaging designs mentioned above suffer the disadvantage of having a packaging area far greater than the LED area. The number of the LEDs that the submount 30 can hold is therefore greatly restricted, even those packaging designs somewhat improve the heat dissipation.

For the reason that conventional LED packaging could not effectively solve the heat dissipation problem, a need has arisen to propose a novel LED packaging to effectively conduct the heat generated from the LED and increase the number of LEDs per packaging area, thereby improving the efficiency of the LED.

SUMMARY OF THE INVENTION

In view of the foregoing, it is an object of the present invention to provide the method for and the structure of the light emitting diode (LED) wafer-level chip scale packaging (WL-CSP), so that the heat generated from the LED could be effectively conducted and the packaging area could be substantially reserved.

According to the object, the present invention provides a light emitting diode (LED) wafer-level chip scale packaging (WL-CSP). According to one embodiment of the present invention, the carrier substrate of the CSP has through holes, which are filled with thermally conductive material; and an LED with a positive electrode and a negative electrode disposed on the same side is attached to the carrier substrate. Accordingly, the heat generated from the LED is conducted to package-to-board connections by way of the filled through holes, and is further conducted to a printed circuit board or a metal plate.

According to another embodiment, the present invention provides a method for the light emitting diode (LED) wafer-level chip scale packaging (WL-CSP). A carrier substrate and an LED are provided, and through holes are formed in the carrier substrate. The through holes are filled with thermally conductive material. Finally, the positive electrode and the negative electrode of the LED are attached to the top surface of the carrier substrate.

DETAILED DESCRIPTION OF THE INVENTION

The detailed description of the present invention will be discussed in the following embodiments, which are not intended to limit the scope of the present invention, but can be adapted for other applications. While drawings are illustrated in details, it is appreciated that the quantity of the disclosed components may be greater or less than that disclosed, except expressly restricting the amount of the components.

FIG. 2A to FIG. 2E schematically illustrate the cross-sectional views of the light emitting diode (LED) wafer-level chip scale packaging (WL-CSP) according to one embodiment of the present invention. As showing in FIG. 2A, a carrier substrate 1 10, which is also known as submount or substrate, is provided, and at least one through hole or thermal via 111 is formed through the carrier substrate 110. Usually, more than one through hole 111 is formed to enhance heat conduction. The through holes 111 could be made by using conventional drilling technique such as etching or laser. Subsequently, the through holes 111 are filled with thermally conductive material 112, which could be, but not limited to, electrically conductive metal, such as copper or silver. The through holes 111 filled with thermally conductive material 112 allow the heat generated by a light emitting diode (LED) to pass though them, as will be discussed in the following paragraphs.

Figure 2A:
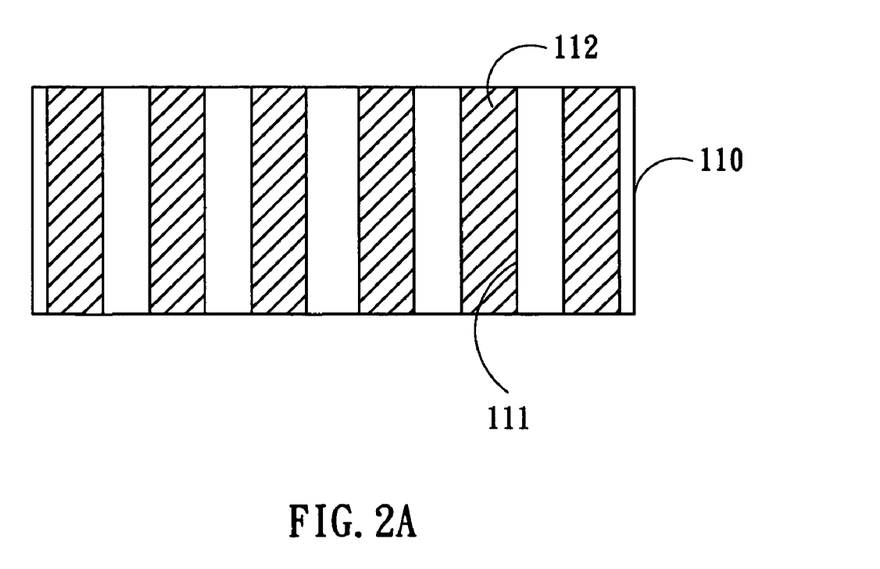
FIG. 2A to FIG. 2E schematically illustrate the cross-sectional views of the light emitting diode (LED) wafer-level chip scale packaging (WL-CSP) according to one embodiment of the present invention.
Figure 2B:
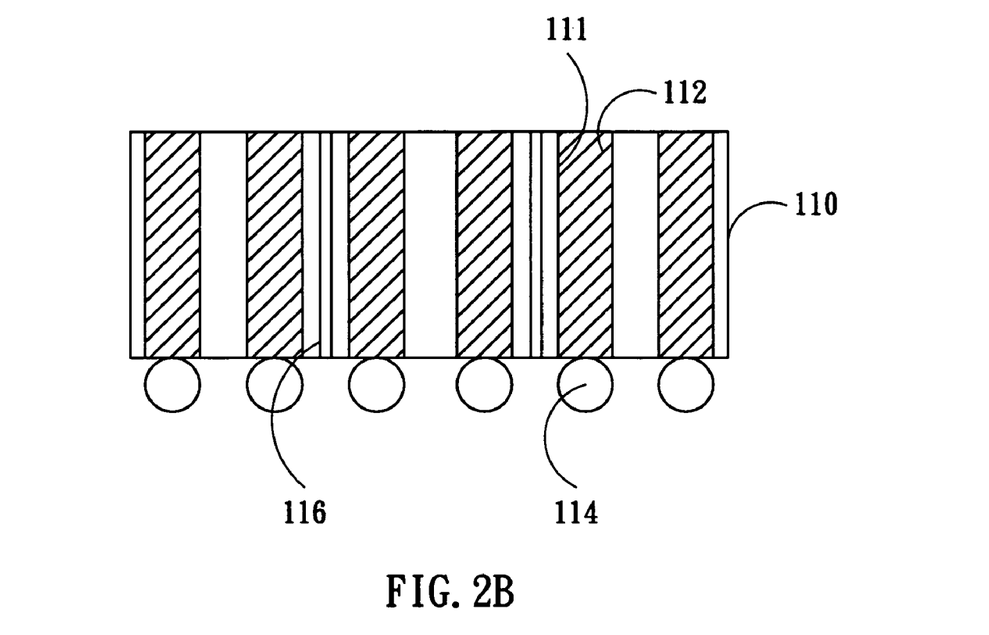

Referring to FIG. 2B, one or more package-to-board connections, such as bumps 114, are bonded to the bottom surface of the carrier substrate 110, and respectively contact with the open edge of the filled through holes 111. The package-to-board connections could be pins, silver paste, or solder paste instead. According to the present embodiment, one or more fill channels 116 are formed through the carrier substrate 110 by using conventional drilling technique such as etching or laser. These fill channels 116 serve later to inject thermally conductive material from the bottom surface of the carrier substrate 110. The inner diameter of the fill channel 116 could be smaller or larger than that of the through hole 111. It is appreciated that the process sequence of bonding the bumps 114 and forming the fill channels 116 could be reversed without affecting the following process.

Figure 2C:
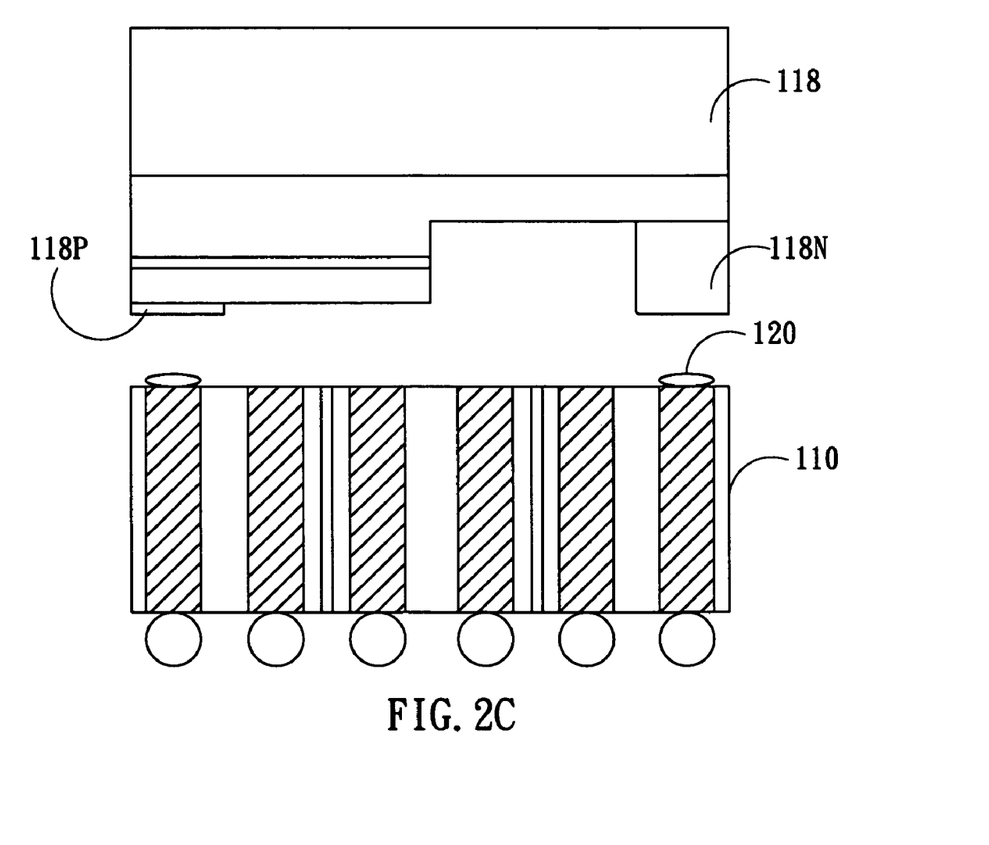
Figure 3A:
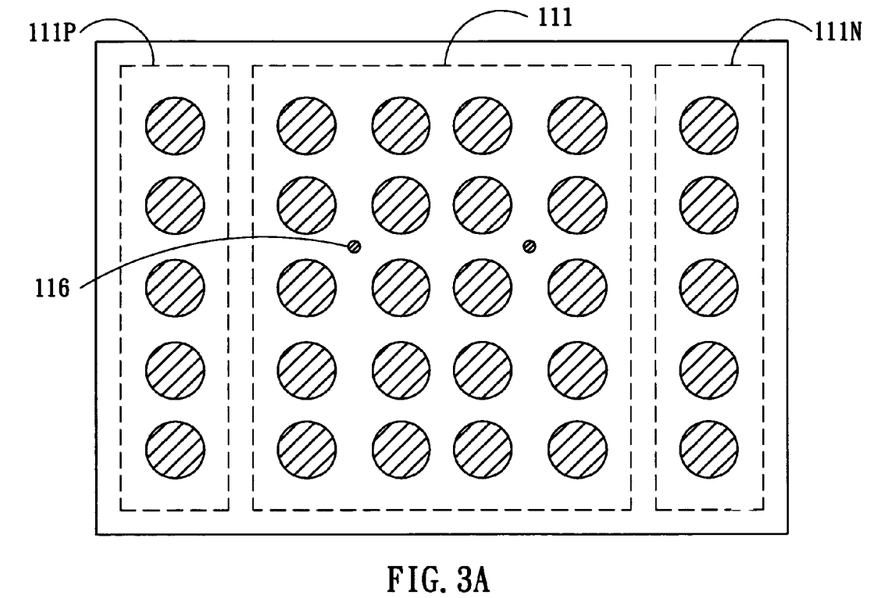
FIG. 3A and FIG. 3B show the top plan view (or bottom plan view) taken toward the top side (or bottom side) of the carrier substrate, revealing the layout of the positive power channel(s), the negative power channel(s), the through holes, and the fill channels.
Figure 3B:
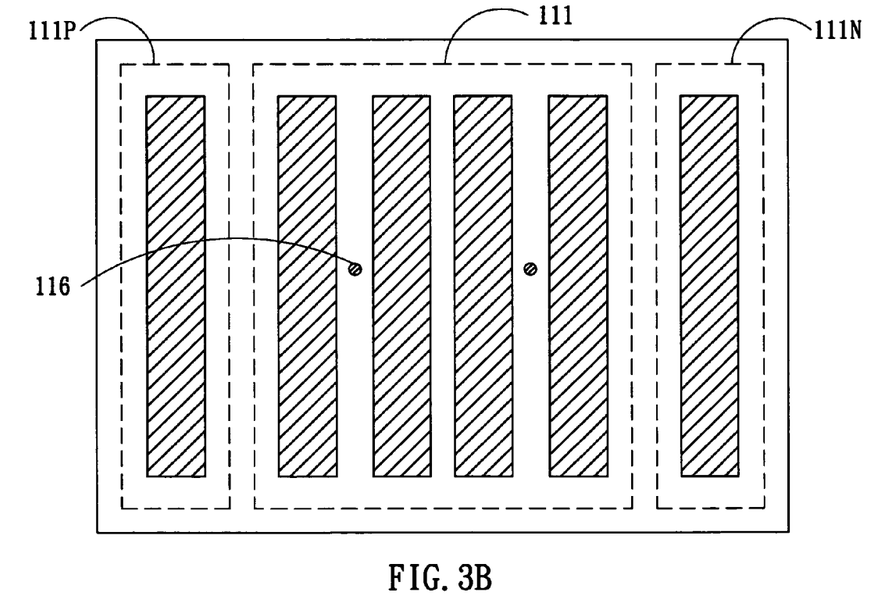

As showing in FIG. 2C, the positive electrode 118P and the negative electrode 118N of a light emitting diode (LED) 118 are attached to the top surface of the carrier substrate 110 by way of solder balls 120. It is noted that the positive electrode 118P and the negative electrode 118N are positioned on the same side of the LED 118, and the quantity of the corresponding solder balls 120 is at least two, but usually more than two. As the LED 118 has many varieties of forms, and its internal structure does not directly affect the process and structure of the wafer-level chip scale packaging (WL-CSP) of the present invention, therefore the LED 118 is merely schematically illustrated, and details are not included in this specification for brevity. It is appreciated that a light emitting diode having its positive electrode(s) and negative electrode(s) positioning on the same side could be adapted to the present invention. For a better understanding of the positive electrode (s) and negative electrode(s) of the LED 118, two exemplary embodiments are illustrated in FIG. 3A and FIG. 3B, which show the top plan view (or bottom plan view) taken toward the top side (or bottom side) of the carrier substrate 110. FIG. 3A shows the layout of positive power channels 111P, negative power channels 111N, the through holes 111, and the fill channels 116, which are arranged in columns. FIG. 3B shows another layout, wherein the positive power channel 111P, the negative power channel 111N, and the through holes 111 are arranged in blocks. It is appreciated that the layout and its arrangement other than those shown is also adaptable.

Figure 2D:
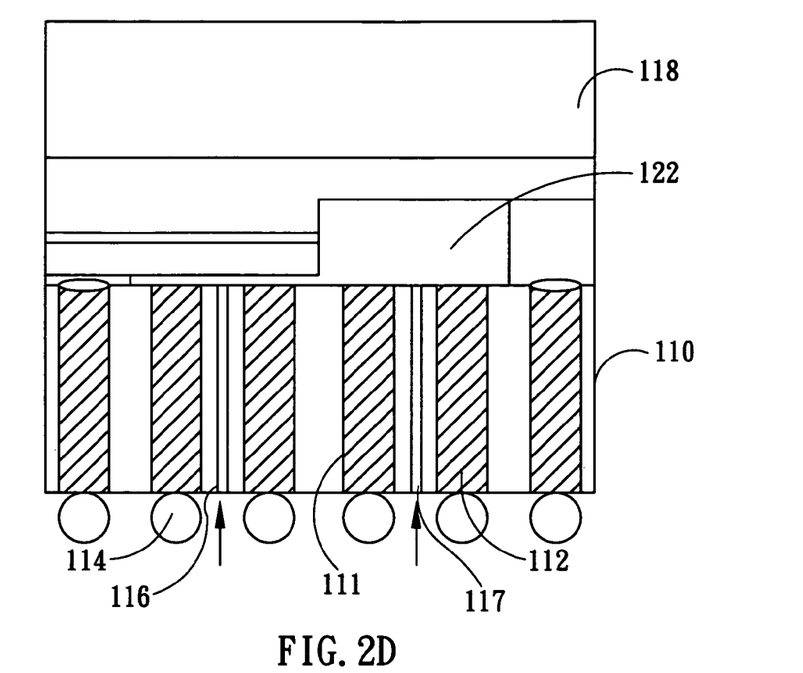

FIG. 2D shows the resultant structure after the LED 118 and the carrier substrate 110 are brought together. Subsequently, thermally conductive dielectric material 117, such as, but not limited to, epoxy resin or polyimide (PI), is injected or filled through the fill channels 116. The injected or filled material 117 is ejected out of the other open edge positioned on the top surface of the carrier substrate 110, and then occupies the space surrounded by the LED 118 and the carrier substrate 110, thereby resulting in a thermally conductive area 122. The resultant thermally conductive area 122 helps conduct the heat generated by the LED 118, which is further conducted through the filled through holes 111 and the bumps 114. It is appreciated that the formation of the thermally conductive area 122 is not limited to that described above, and even the existence of the thermally conductive area 122 is optional.

Figure 2E:
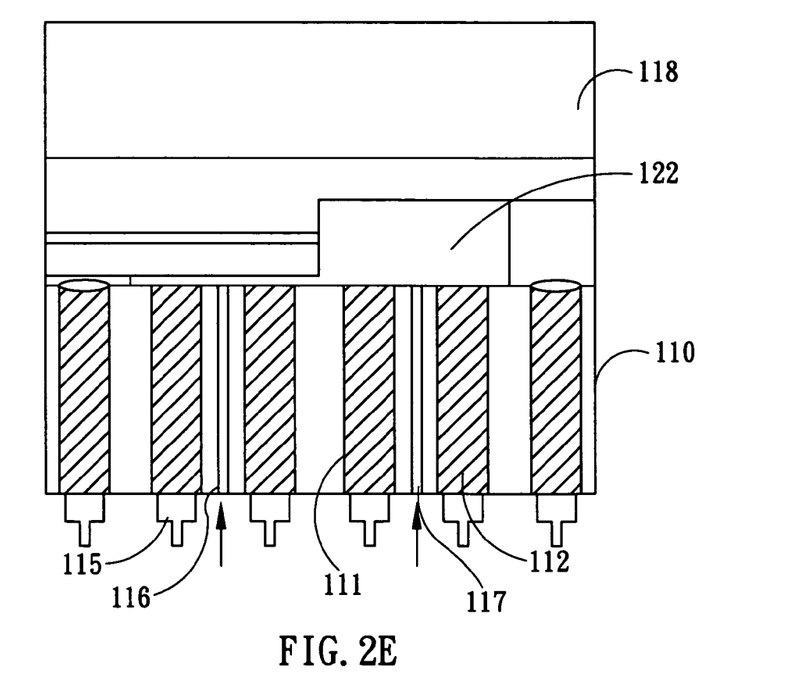

FIG. 2E shows another resultant structure with a pin-through-hole configuration, in which pins 115 are used instead of the bumps 114.

Figure 4A:
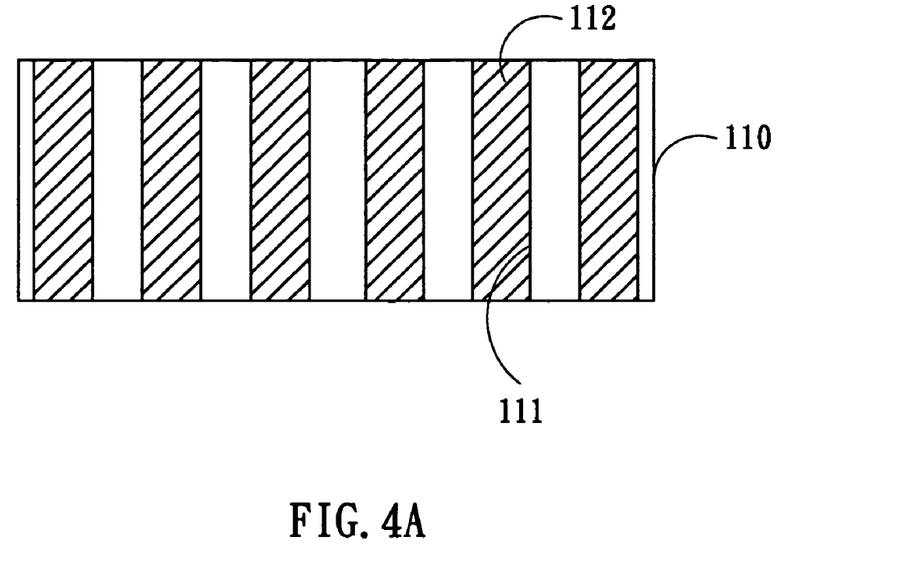
FIG. 4A to FIG. 4E schematically illustrate the cross-sectional views of the light emitting diode (LED) wafer-level chip scale packaging (WL-CSP) according to another embodiment of the present invention.
Figure 4B:
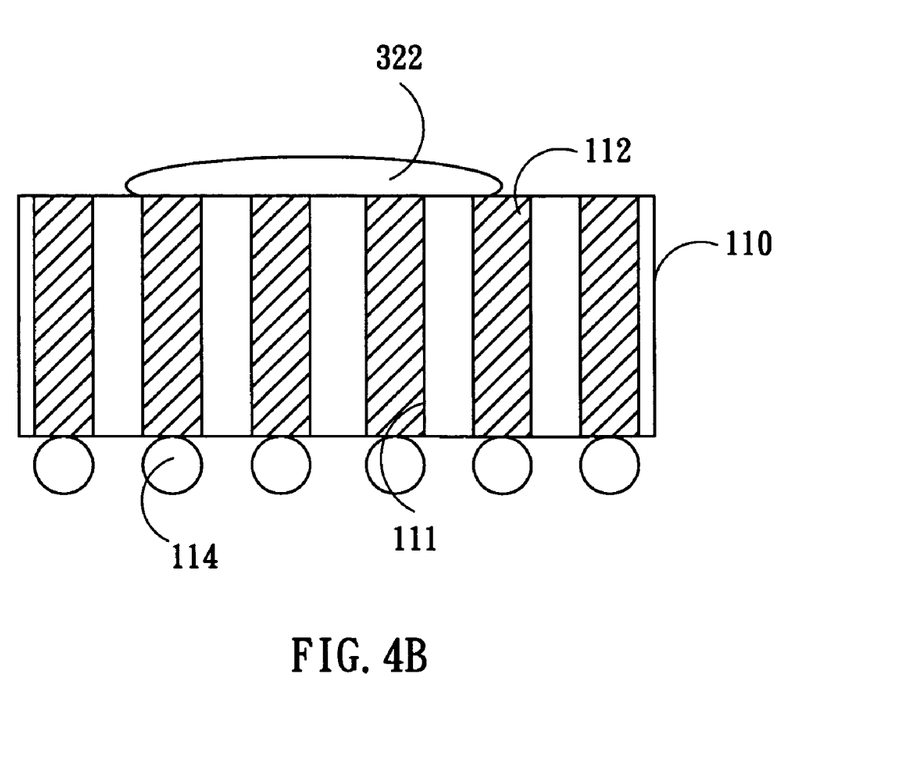
Figure 4C:
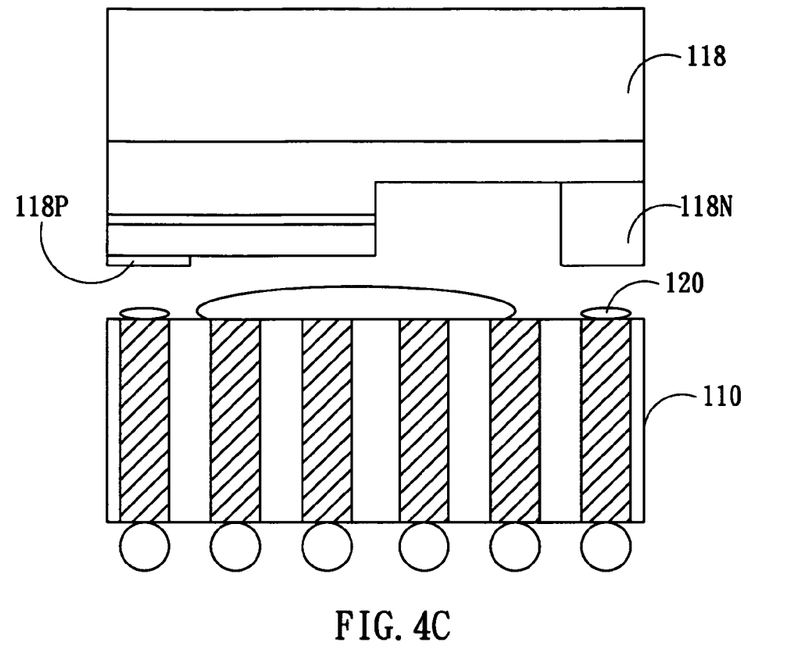
Figure 4D:
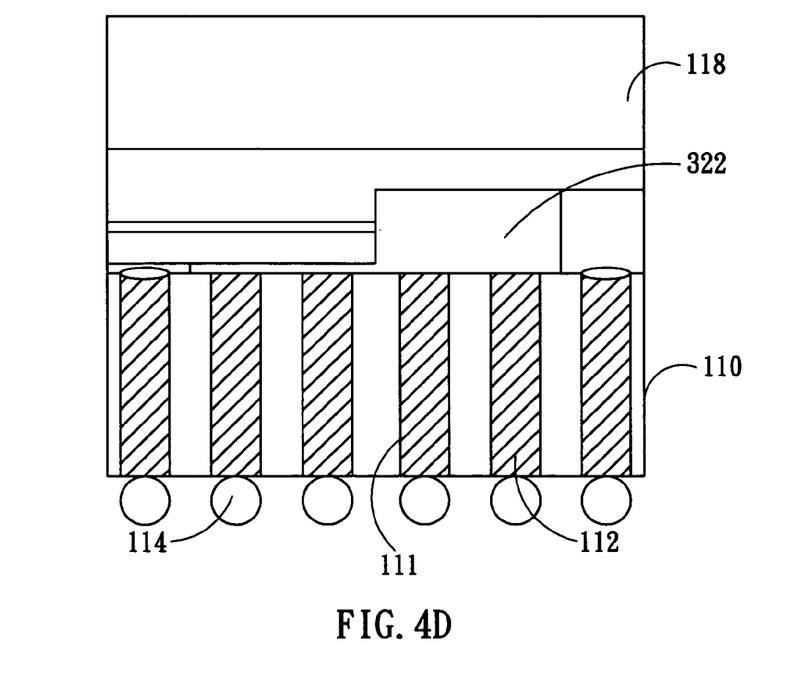
Figure 4E:
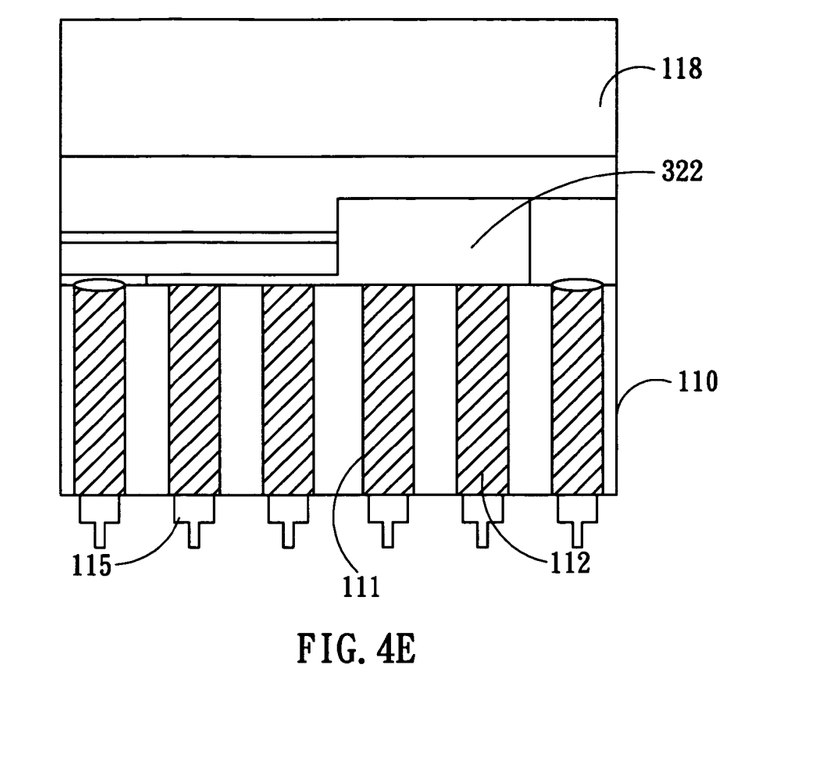

FIG. 4A to FIG. 4E schematically illustrate the cross-sectional views of the light emitting diode (LED) wafer-level chip scale packaging (WL-CSP) according to another embodiment of the present invention. The composing elements in FIGS. 4A-4E that are the same as corresponding ones in FIGS. 2A-2E are labeled with the same reference numerals. The through holes 111 in the carrier substrate 110 are filled with thermally conductive material 112 (FIG. 4A) as illustrated in the previous embodiment, but there is no fill channel (116 of FIG. 2B) formed. Instead, thermally conductive dielectric material 322 is applied partially on the top surface of the carrier substrate 110 (FIG. 4B) before or after the bumps 114 are bonded. After the LED 118 and the carrier substrate 110 are attached to each other (FIGS. 4C and 4D), a thermally conductive area 322 is thus confined and formed in the space surrounded by the LED 118 and the carrier substrate. 110 (FIG. 4D). FIG. 4E shows another resultant structure with a pin-through-hole configuration, in which pins 115 are used instead of the bumps 114.

Figure 5A:
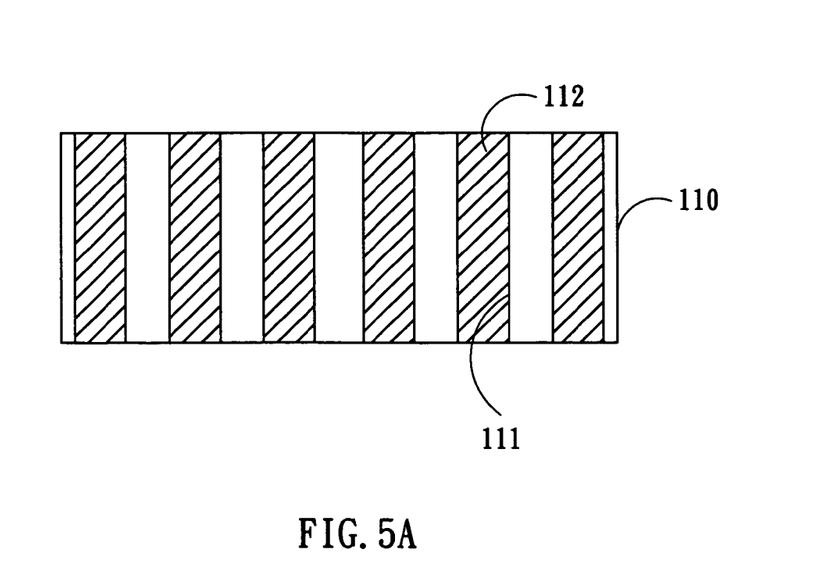
FIG. 5A to FIG. 5E schematically illustrate the cross-sectional views of the light emitting diode (LED) wafer-level chip scale packaging (WL-CSP) according to a further embodiment of the present invention.
Figure 5B:
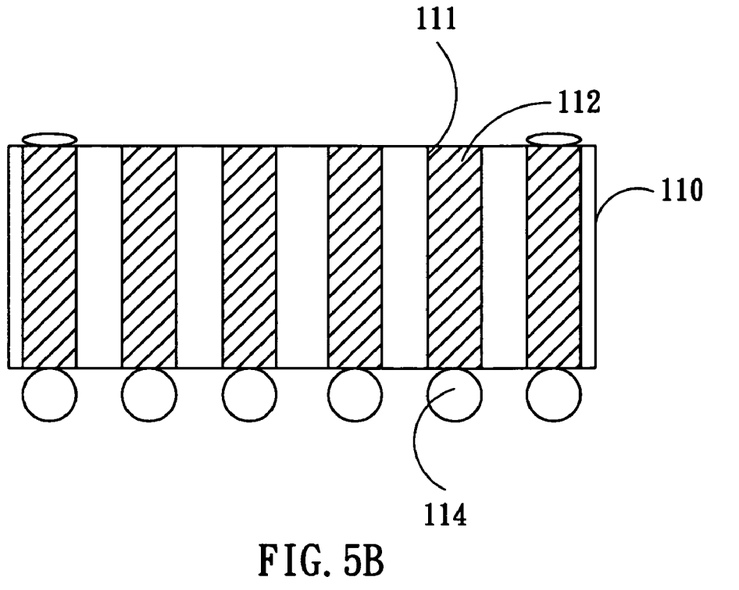
Figure 5C:
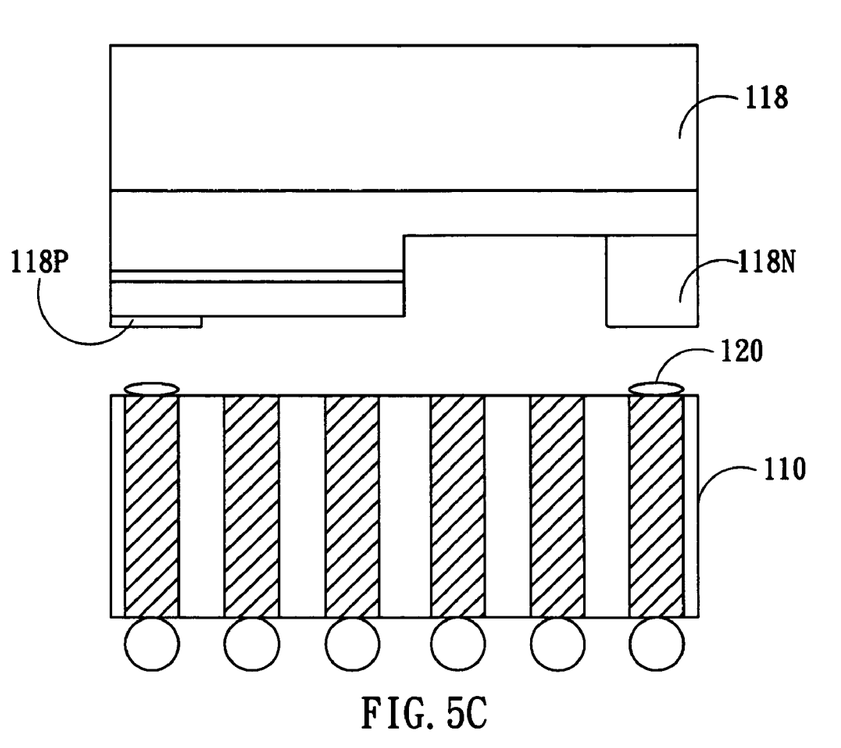
Figure 5D:
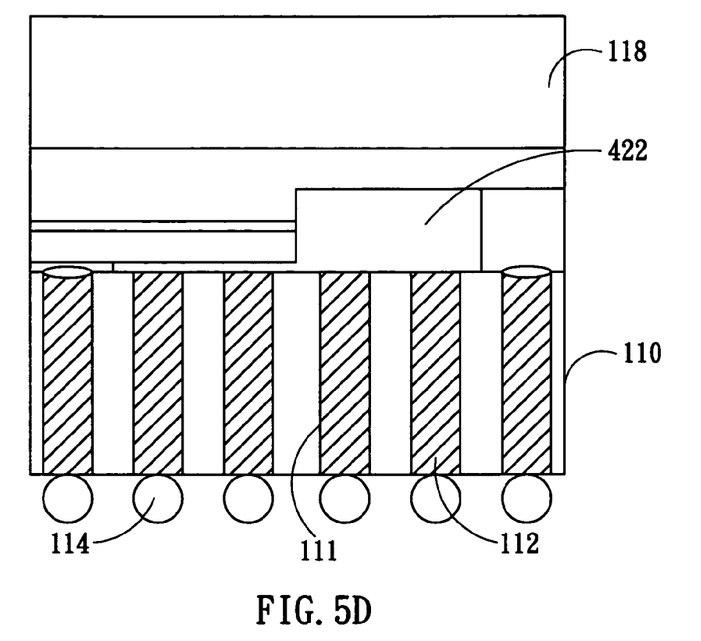
Figure 5E:
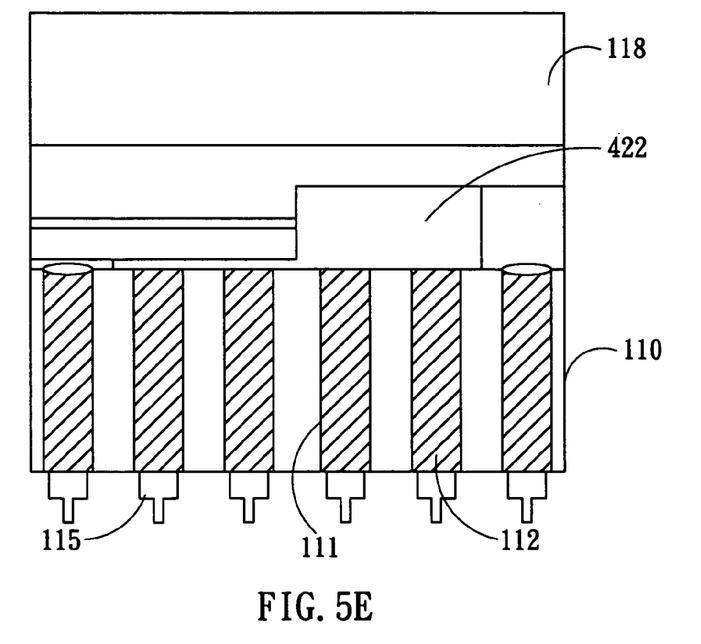

FIG. 5A to FIG. 5E schematically illustrate the cross-sectional views of the light emitting diode (LED) wafer-level chip scale packaging (WL-CSP) according to a further embodiment of the present invention. The composing elements in FIGS. 5A-5E that are the same as corresponding ones in FIGS. 2A-2E are labeled with the same reference numerals. The through holes 111 in the carrier substrate 110 are filled with thermally conductive material 112 (FIG. 5A) as illustrated in the previous embodiment, but there is no fill channel (116 of FIG. 2B) formed before or after the bumps 114 are bonded (FIG. 5B). Instead, after the LED 118 and the carrier substrate 110 are attached to each other (FIGS. 5C and 5D), thermally conductive dielectric material 422 is injected into the space surrounded by the LED 118 and the carrier substrate 110 (FIG. 5D) by using conventional underfill technique, thereby resulting in a thermally conductive area 422. FIG. 5E shows another resultant structure with a pin-through-hole configuration, in which pins 115 are used instead of the bumps 114.

Figure 6A:
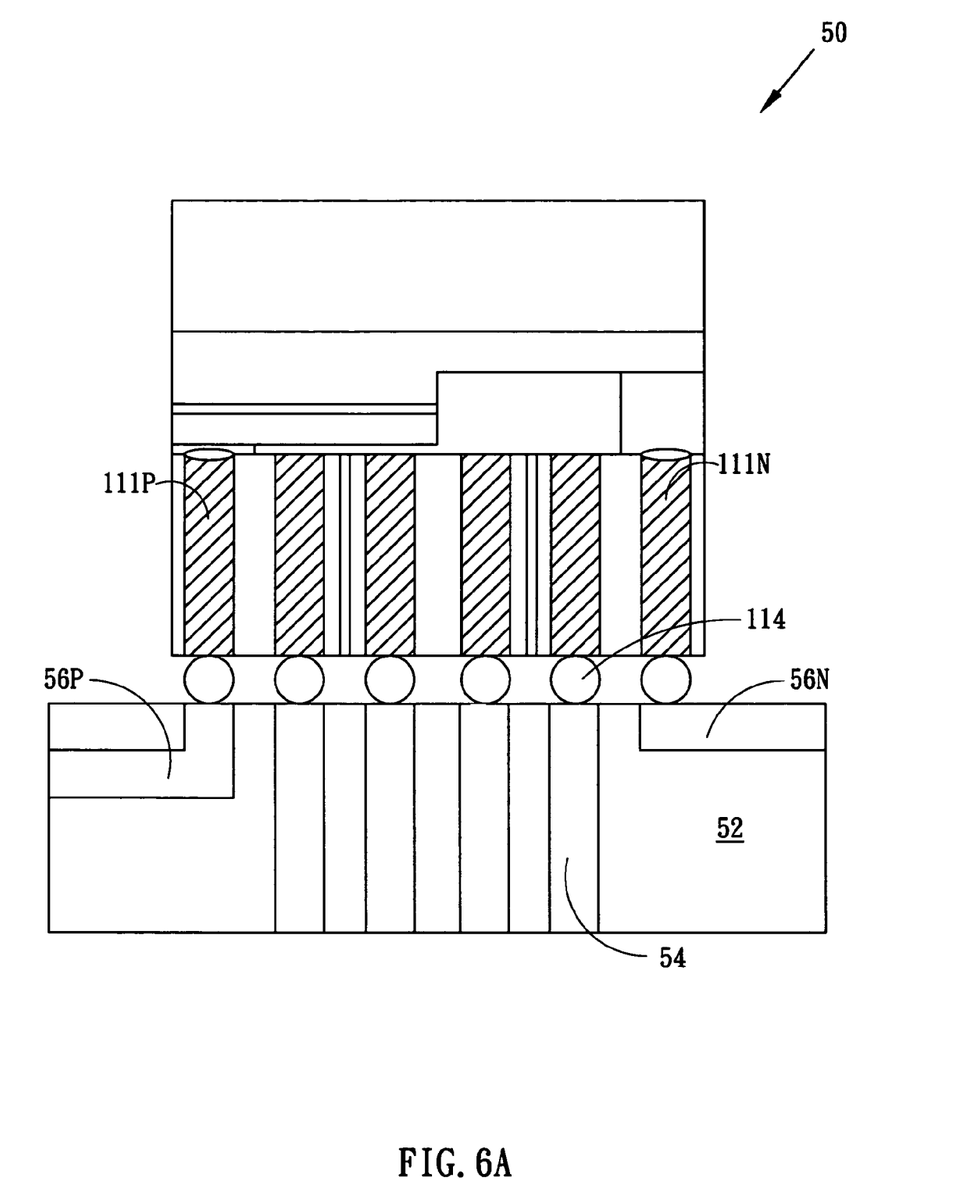
FIGS. 6A-6B show an exemplary application of the light emitting diode (LED) wafer-level chip scale packaging (WL-CSP) obtained from the embodiments of the present invention.
Figure 6B:
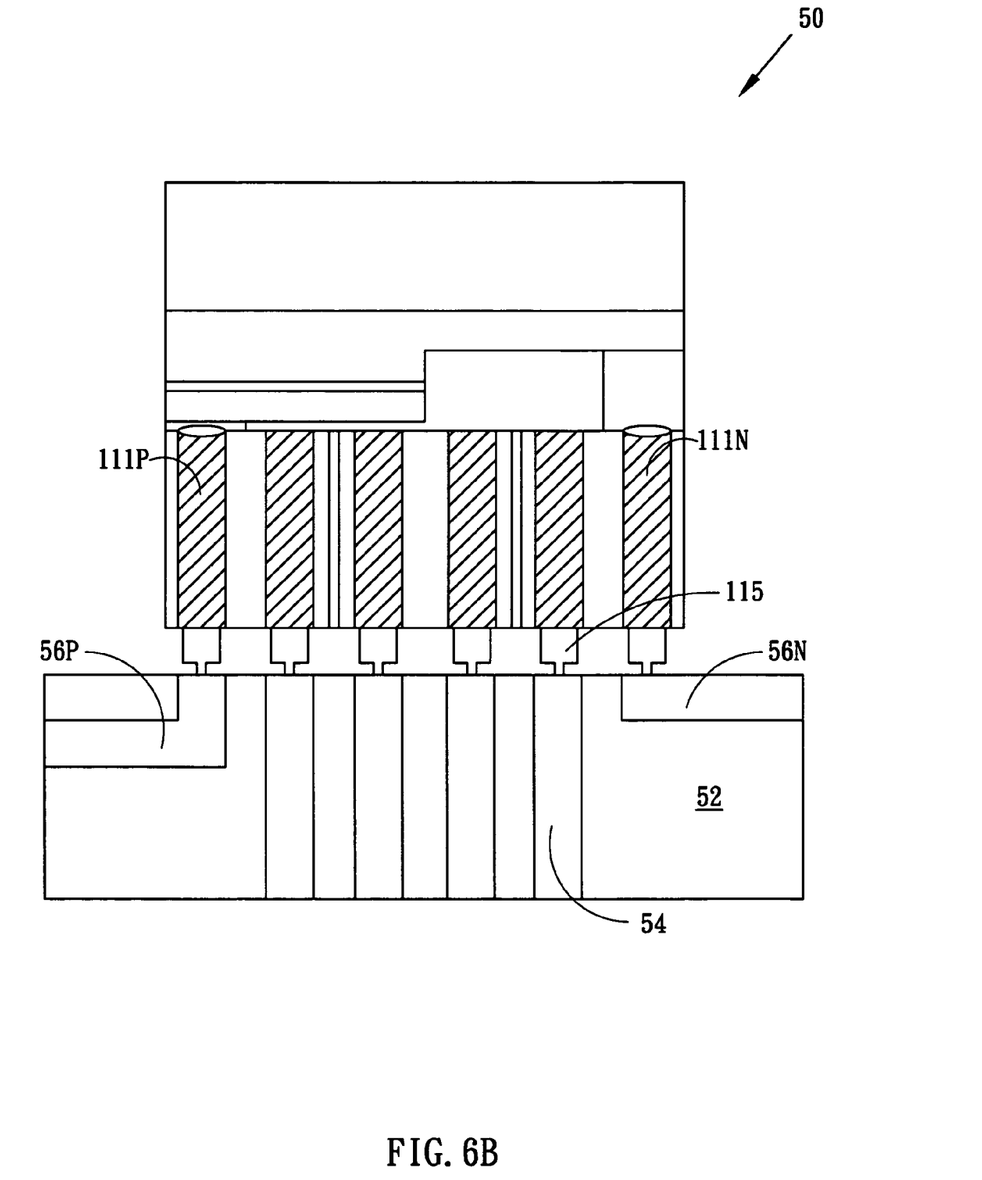

The light emitting diode (LED) wafer-level chip scale packaging (WL-CSP) obtained from the previously discussed embodiments could be accordingly applied in various LED devices, two of those are exemplified in FIG. 6A and FIG. 6B.

Referring to FIG. 6A, the wafer-level chip scale packaged (WL-CSP) LED 50 is bonded with the bond pads (not shown) of a printed circuit board (PCB) 52 through the bumps 114. The bumps 114 are further respectively and thermally connected to one end of the vias 54, which are filled with thermally conductive material. A heat sink (not shown in the figure) could be used as well to further enhance the heat conduction, in which the heat sink could be contacted with the other (bottom) end of the vias 54. The positive power channel 111P of the packaged LED 50 electrically connects to a positive power end 56P through the bump 114, and the negative power channel 111N electrically connects to a negative power end 56N through the bump 114, wherein the positive power end 56P and the negative power end 56N may be disposed within different area or different layer of the printed circuit board 52. FIG. 6B shows another structure with a pin-through-hole configuration, in which pins 115 are used instead of the bumps 114.

Figure 6C:
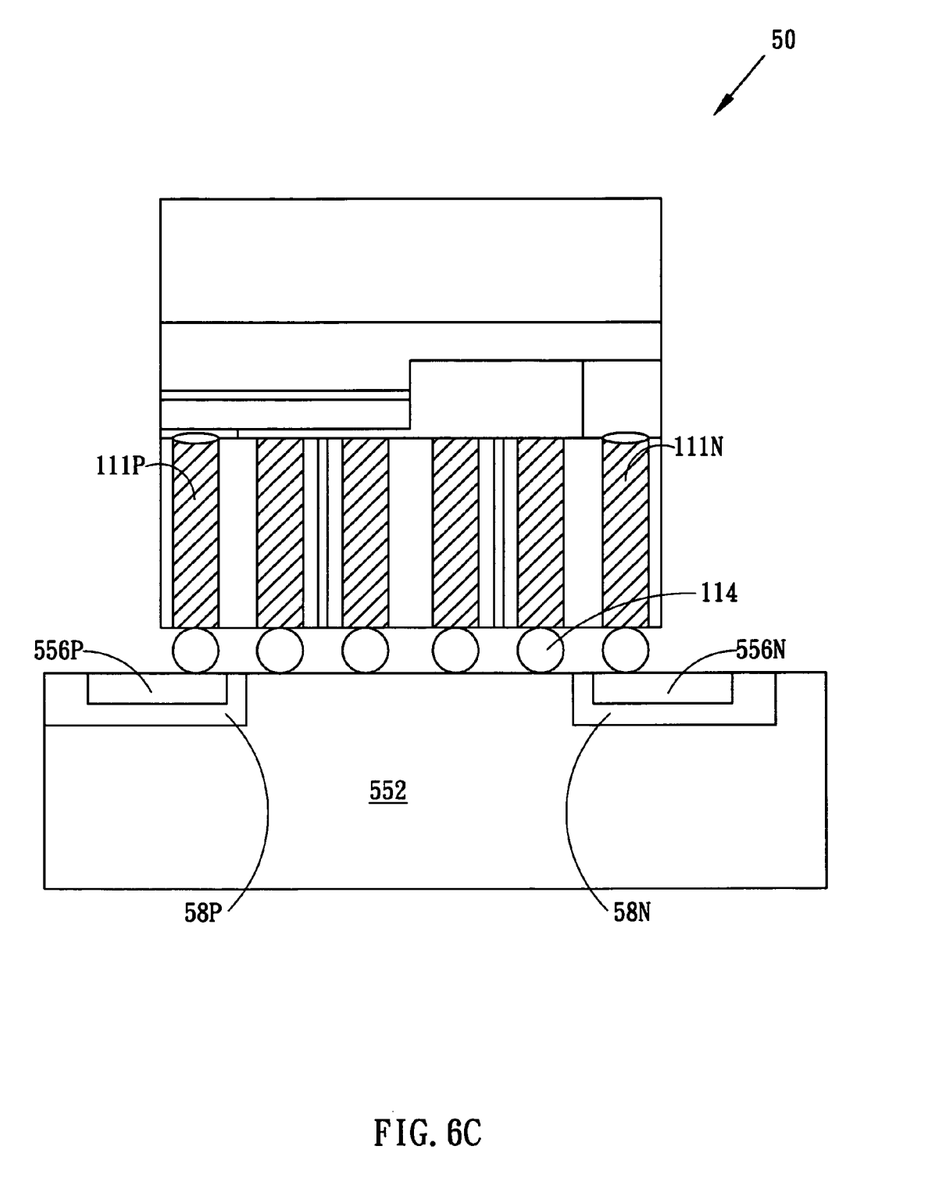
FIGS. 6C-6D show another exemplary application of the light emitting diode (LED) wafer-level chip scale packaging (WL-CSP) obtained from the embodiments of the present invention
Figure 6D:
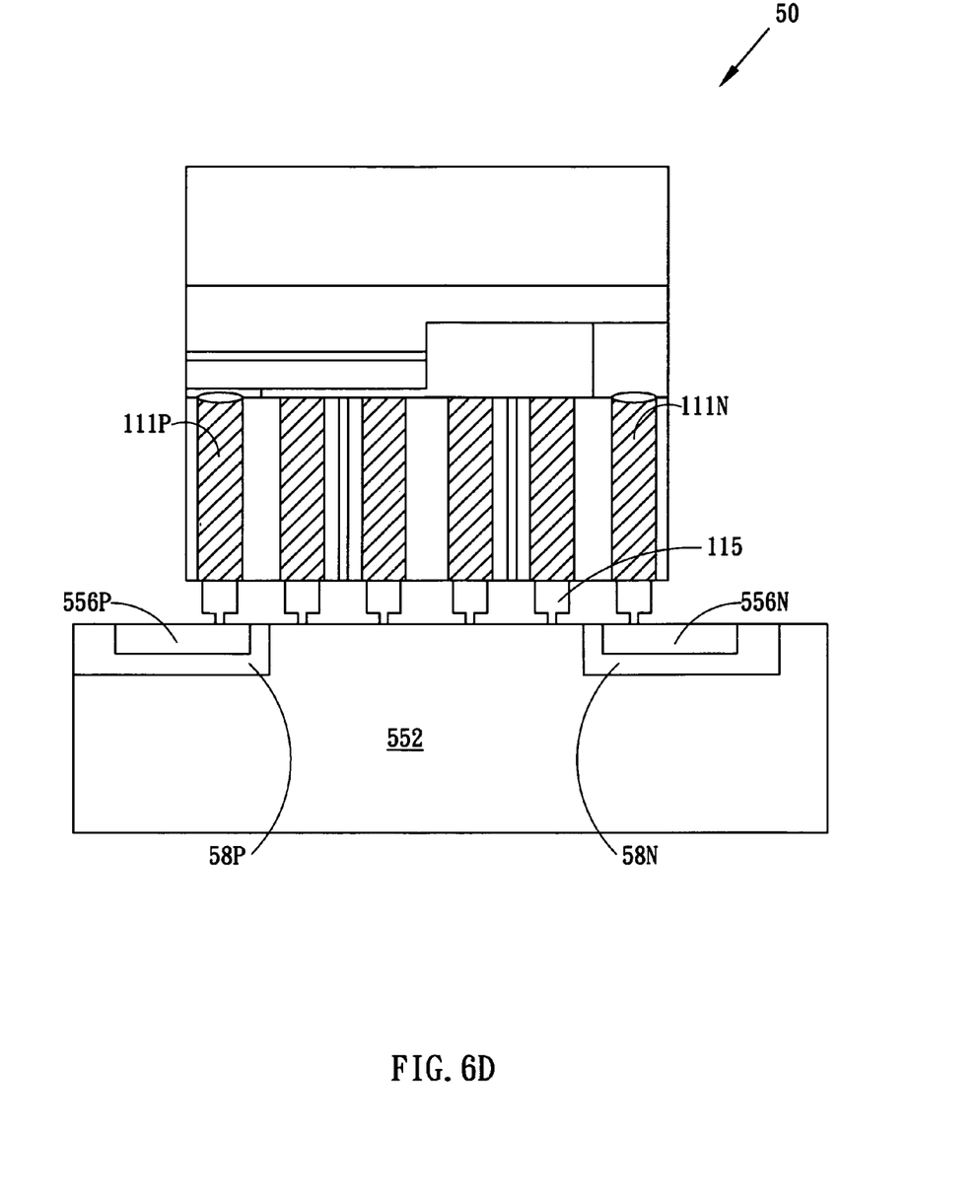

FIG. 6C illustrates another exemplary LED device, in which the packaged LED 50 is bonded with a metal plate/block 552 through the bumps 114. A heat sink (no shown in the figure) could be used as well to further enhance the heat conduction. The positive power channel 111P of the packaged LED 50 electrically connects to a positive power end 556P through the bump 114, and the negative power channel 111N electrically connects to a negative power end 556N through the bump 114, wherein the positive power end 556P and the negative power end 556N are usually disposed within different area of the metal plate/block 552, which are electrically insulated from the rest of the metal plate/block 552 by way of electrically insulating layers 58P and 58N, such as oxide layers. FIG. 6D shows another structure with a pin-through-hole configuration, in which pins 115 are used instead of the bumps 114.

Although specific embodiments have been illustrated and described, it will be appreciated by those skilled in the art that various modifications may be made without departing from the scope of the present invention, which is intended to be limited solely by the appended claims.

What is claimed is:

1. A light emitting diode (LED) wafer-level chip scale packaging, comprising:
    an LED with a positive electrode and a negative electrode disposed on one side thereof;
    a carrier substrate having a plurality of through holes, which are filled with an electrically and thermally conductive material,
    wherein the positive electrode and the negative electrode of said LED are attached to a first surface of said carrier substrate,
    wherein the positive electrode is electrically and thermally connected to a first one of said through holes and the negative electrode is electrically and thermally connected to a second one of said through holes;
    a thermally conductive area filled with a thermally conductive dielectric material, which is confined in an area surrounded by said LED and said carrier substrate and is contacted with at least a third one of said filled through holes; and
    at least one fill channel within said carrier substrate,
    said fill channel contacting said thermally conductive area and filled with said thermally conductive dielectric material.

2. The LED wafer-level chip scale packaging according to claim 1, further comprising at least two solder balls, which are respectively disposed between the LED's positive electrode and the carrier substrate, and between the LED's negative electrode and the carrier substrate, so that said LED is attached to said carrier substrate.

3. The LED wafer-level chip scale packaging according to claim 1, further comprising a void space which is confined by said LED and said carrier substrate.

4. The LED wafer-level chip scale packaging according to claim 1, further comprising at least one package-to-board connection coupled to a second surface of said carrier substrate and contacted with the filled through hole, thereby heat generated from said LED is conducted to said package-to-board connection by way of the filled through hole.

5. The LED wafer-level chip scale packaging according to claim 4, wherein said package-to-board connection comprises a bump, a pin, silver paste, or solder paste.

6. The LED wafer-level chip scale packaging according to claim 4, further comprising at least one positive power channel and at least one negative power channel within said carrier substrate, one end of the positive power channel and the negative power channel being respectively electrically connected to the positive electrode and the negative electrode of said LED, and other end of the positive power channel and the negative power channel being respectively connected to the package-to-board connection, wherein the positive power channel and the negative power channel are filled with electrically conductive material, thereby the positive electrode and the negative electrode of said LED is electrically connected to the package-to-board connection.

7. The LED wafer-level chip scale packaging according to claim 1, wherein said at least one through hole is arranged in columns.

8. The LED wafer-level chip scale packaging according to claim 1, wherein said at least one through hole is arranged in blocks.

9. A method for light emitting diode (LED) wafer-level chip scale packaging, comprising:
    providing a carrier substrate and an LED,
    said LED having a positive electrode and a negative electrode disposed on one side thereof;
    forming a plurality of through holes in said carrier substrate, said through holes passing through between a first surface and a second surface of said carrier substrate;
    filling the through holes with an electrically and thermally conductive material;
    forming at least one fill channel in said carrier substrate;
    attaching the positive electrode and the negative electrode of said LED to the first surface of said carrier substrate, wherein the positive electrode is electrically and thermally connected to a first one of said through holes and the negative electrode is electrically and thermally connected to a second one of said through holes;
    injecting thermally conductive dielectric material from said second surface into an area surrounded by said LED and said carrier substrate by way of the fill channel, such that said thermally conductive dielectric material is contacted with at least a third one of said through holes.

10. The method according to claim 9, after said LED is attached to said carrier substrate, further comprising injecting thermally conductive material into an area surrounded by said LED and said carrier substrate by the way of the fill channel.

11. The method according to claim 9, before said LED is attached to said carrier substrate, further comprising applying thermally conductive material on the first surface of said carrier substrate.

12. The method according to claim 9, after said LED is attached to said carrier substrate, further comprising performing underfill to fill thermally conductive material into an area surrounded by said LED and carrier substrate.

13. The method according to claim 9, further comprising forming a void space which is confined by said LED and said carrier substrate.

14. The method according to claim 9, wherein said step of attaching the LED and the carrier substrate is achieved by forming at least two solder balls, which are respectively disposed between the LED's positive electrode and the carrier substrate, and between the LED's negative electrode and the carrier substrate, so that said LED is attached to said carrier substrate.

15. The method according to claim 9, further comprising coupling at least one package-to-board connection to the second surface of said carrier substrate, said package-to-board connection contacting with the filled through hole.

16. The method according to claim 15, wherein said package-to-board connection comprises a bump, a pin, silver paste, or solder paste.

17. The method according to claim 15, further comprising forming at least one positive power channel and at least one negative power channel within said carrier substrate, one end of the positive power channel and the negative power channel being respectively electrically connected to the positive electrode and the negative electrode of said LED, and other end of the positive power channel and the negative power channel being respectively connected to the package-to-board connection, wherein the positive power channel and the negative power channel are filled with electrically conductive material, thereby the positive electrode and the negative electrode of said LED is electrically connected to the package-to-board connection.

18. A light emitting diode (LED) device, comprising:
  at least one LED wafer-level chip scale packaging, each comprising:
    an LED with a positive electrode and a negative electrode disposed on one side thereof;
    a carrier substrate a plurality of through holes, which are filled with an electrically and thermally conductive material,
    wherein the positive electrode and the negative electrode of said LED are attached to a first surface of said carrier substrate,
    wherein the positive electrode is electrically and thermally connected to a first one of said through holes and the negative electrode is electrically and thermally connected to a second one of said through holes, and
    at least one package-to-board connection coupled to a second surface of said carrier substrate and contacted with the filled through hole,
    thereby heat generated from said LED is conducted to said package-to-board connection by way of the filled through holes;
  a board bonded to said LED wafer-level chip scale packaging through the package-to-board connection;
  a thermally conductive area filled with a thermally conductive material, which is confined in an area surrounded by said LED and said carrier substrate, and is contacted with at least a third one of said filled through holes; and
  at least one fill channel within said carrier substrate,
    said fill channel contacting said thermally conductive area and filled with said thermally conductive dielectric material.

19. The LED device according to claim 18, wherein said board comprises at least one via, which is filled with thermally conductive material therein, one end of said via being contacted with the package-to-board connection.

20. The LED device according to claim 19, further comprising a heat sink contacted with other end of said via.

21. The LED device according to claim 18, wherein said board is made of conductive material.

22. The LED device according to claim 18, further comprising at least two solder balls, which are respectively disposed between the LED's positive electrode and the carrier substrate, and between the LED's negative electrode and the carrier substrate, so that said LED is attached to said carrier substrate.

23. The LED device according to claim 18, further comprising a void space which is confined by said LED and said carrier substrate.

24. The LED device according to claim 18, wherein said package-to-board connection comprises a bump, a pin, silver paste, or solder paste.

* * * * *